United States Patent
Chan et al.

(10) Patent No.: US 6,185,133 B1
(45) Date of Patent: *Feb. 6, 2001

(54) FLASH EPROM USING JUNCTION HOT HOLE INJECTION FOR ERASE

(75) Inventors: Vei-Han Chan, San Jose; David K. Y. Liu; Kou-Su Chen, both of Fremont, all of CA (US)

(73) Assignee: AMIC Technology, Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/105,551

(22) Filed: Jun. 26, 1998

(51) Int. Cl.[7] .................................................. G11C 16/04
(52) U.S. Cl. .............................. 365/185.29; 365/185.24; 365/185.26
(58) Field of Search ..................... 365/185.29, 185.24, 365/185.33, 185.26

(56) References Cited

U.S. PATENT DOCUMENTS

| | | | | |
|---|---|---|---|---|
| 5,485,423 | * | 1/1996 | Tang et al. ...................... | 365/185.29 |
| 5,491,657 | | 2/1996 | Haddad et al. .................. | 365/185.27 |
| 5,625,600 | * | 4/1997 | Hong ................................ | 365/218 |
| 5,629,893 | * | 5/1997 | Tang et al. ...................... | 365/185.29 |
| 5,659,504 | | 8/1997 | Bude et al. ...................... | 365/185.27 |
| 5,677,876 | * | 10/1997 | Tanaka ............................ | 365/185.28 |
| 5,781,477 | * | 7/1998 | Rinerson et al. ................ | 365/185.29 |
| 5,812,459 | * | 9/1998 | Atsumi et al. ................... | 365/185.23 |
| 5,825,689 | * | 10/1998 | Wakita ............................ | 365/185.11 |
| 5,831,905 | * | 11/1998 | Hirano ............................. | 365/185.29 |
| 5,838,618 | * | 11/1998 | Lee et al. ........................ | 365/185.29 |
| 5,917,755 | * | 6/1999 | Rinerson et al. ................ | 365/185.28 |

OTHER PUBLICATIONS

Endoh, T. et al., "New Write/Erase Operation Technology for Flash EEPROM Cells to Improve the Read Disturb Characteristics," *IEDM*, Apr. 1992, pp. 603–606.

Oyama, K. et al., "A Novel Erasing Technology for 3.3V Flash Memory with 64Mb Capacity and Beyond," *IEDM*, Apr. 1992, pp. 607–610.

Miyawaki, Y. et al., "A New Erasing and Row Decoding Scheme for Low Supply Voltage Operation 16Mb/64Mb Flash EEPROMs," *Symposium on VLSI Circuits*, 1991, pp. 85–86.

* cited by examiner

*Primary Examiner*—Son Mai
(74) *Attorney, Agent, or Firm*—Law+

(57) ABSTRACT

A novel erase mechanism using junction hot hole injection is disclosed for flash memory cell sector and bulk erase operations. A constant current supply is used so that a suitable junction voltage breakdown can be provided despite expected variations in cell structures, operations, etc. The inventive method eliminates the need for dual polarity voltage supplies for erase operations, and provides a method to achieve a tight distribution of erased cell threshold voltages. In addition, over-erasure problems associated with Fowler-Nordheim tunneling are essentially eliminated.

41 Claims, 7 Drawing Sheets

FLASH EPROM USING JUNCTION HOT HOLE INJECTION FOR ERASE

FIELD OF THE INVENTION

The invention relates generally to an erasing mechanism for flash EPROM devices. The invention is particularly useful for flash arrays because it is lower in cost to implement, has better convergence, and offers more functionality than traditional Fowler-Nordheim (FN) sector or bulk erase mechanisms.

BACKGROUND OF THE INVENTION

A typical prior art flash EPROM cell with a double poly stacked gate structure is illustrated in FIG. 1. Such cell includes a source & drain region (one of which are typically connected to a common bit line), a control gate (poly 2 layer) an intergate dielectric (ONO layer), a floating gate (poly 1 layer) and a gate dielectric (tunnel oxide layer). A channel region lies between the gate dielectric and substrate, and runs lengthwise between the source/drain regions. In a conventional NOR based array architecture of such cells, hot-electron injection induced by a large channel electric field is used to charge the floating gate (poly 1 layer) in such cell. FN tunneling is used to discharge the floating gate, through the application of a large negative voltage to the control gate and a positive voltage to the source or substrate.

A known problem with using FN tunneling for an erase operation with such cell and array architectures is the possibility of an over-erase condition. This is an inevitable limitation resulting from a number of aspects of such architectures, including manufacturing variations, oxide layer wear, erase voltage fluctuations, etc. This condition arises when a threshold voltage $V_t$ of a cell becomes negative as a result of an erase operation performed in the EPROM. The over-erase condition of such cell leads to a number of well-known operational errors, and affects the scalability and reliability of this particular architecture. Consequently, significant research is expended in the field of flash EPROMs to develop cell structures and array operations that minimize the cell threshold variations therein.

Other problems associated with FN tunneling include the fact that such operations typically require two polarities of voltage, and this further necessitates the inclusion of a negative charge pump, thus increasing device size and complexity. Furthermore, manufacturing & processing complexity are relatively high with FN tunneling based EPROMs, since a triple well is also required to sustain the negative erase voltage. An example of such structure is seen in U.S. Pat. No. 5,491,657 to Haddad et. al., which is incorporated by reference herein. Finally, sophisticated embedded erase algorithms are also needed when using FN tunneling erase operations, and this further drives up the cost of such devices. While Haddad et. a indicate (column 6, 11. 44–50) that erasing of flash arrays using hot hole injection (rather than FN tunneling) is known in the art, Haddad et. al. also confirms that the approaches to date have had only limited success and utility since they yield widely varying threshold variations in the erased cells.

SUMMARY OF THE INVENTION

An object of the present invention, therefore, is to provide a circuit and method of erasing cells in a flash memory array that eliminates the need for a FN tunnelling operation in such array;

Another object of the present invention is to provide a circuit and method of erasing flash memory cells so that threshold voltage distributions of such cells are tightened, thereby increasing the functional performance of devices using such cells;

Yet another object of the present invention, is to provide a circuit and method of erasing cells in a flash memory array that improves device integration, cost and reliability by avoiding the use of erase support circuitry such as negative voltage charge pumps.

These and other objects are effectuated by a novel circuit and method for flash cell erasure disclosed in detail herein. A memory cell in a flash memory cell array (which cell typically includes a control gate, a floating gate, a source, a drain, a channel region between the source and drain, and a gate dielectric situated both between the floating gate and the source and drain, as well as between the channel and an associated substrate) is erased by first applying a positive erase voltage to either the source or drain of such cell, while the other of the source or drain regions is left floating. Only a single positive supply voltage is required, and this eliminates the need for bulky charge pumps. As a result of the fact that the substrate is also grounded, an avalanche condition occurs in a junction between the source/drain and substrate, and his creates a plasma of electron and hole pairs near the surface. The potential of the control gate is kept grounded or preferably slightly negatively biased, and this favors the attraction of positive charge carriers to move into the floating gate to erase the cell.

The present invention, therefore, can be incorporated within (and manufactured as part of) a conventional flash memory integrated circuit including a conventional array of flash memory cells and peripheral support circuitry coupled to the array. A constant current source generator capable of generating a specified current quantity I can be included as part of such peripheral circuitry. A control circuit coupled to the array and the peripheral support circuitry is configured to accomplish an erase operation using the method described immediately above. As the present invention does not require a programming operation first, an erase algorithm embedded in such circuit can be simplified significantly.

A constant current source is preferably used so that different positive erase voltages can be generated for cells having different operating characteristics. This approach ensures that variations in cell thresholds arising from different manufacturing/processing conditions, and different temperature conditions, are also handled without affecting performance.

As the cells are erased, their threshold voltages rapidly converge to a target value. After such target value is achieved, it does not vary substantially because an electric field in the gate dielectric is now balanced, and thus permits an approximately equal number of positive and negative carriers to move into the floating gate. This prevents the common problem of over-erasure typically present in prior art designs.

It can be seen that this method permits an entire sector of flash cells to be erased simultaneously, and without first pre-programming them to a known threshold voltage condition. This further reduces an erase time and makes the invention extremely attractive for use in flash memory cell chip architectures.

As the present invention does not utilize conventional Fowler-Nordheim tunnelling, over-erasure problems, processing complexity, and operating voltage logic complexity are also reduced significantly.

DETAILED DESCRIPTION OF THE INVENTION

To eliminate the aforementioned limitations of FN tunnelling, the present invention relies instead on the use of junction hot hole injection for discharging a floating gate of an EPROM cell. In this manner, no variation or change needs to be made to a typical prior art EPROM cell, and yet at the same time the possibility of over-erased cells is practically eliminated, along with the need for complicated erase algorithms.

Figure 1:
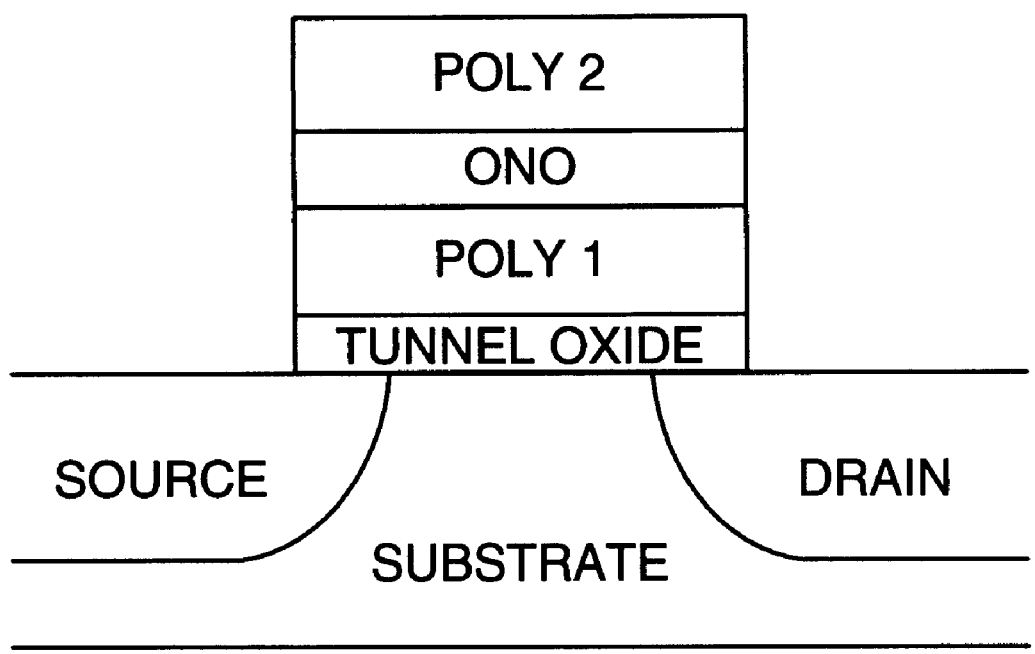
FIG. 1 is a structural representation of a conventional prior art flash memory cell.

To accomplish these goals, the present invention merely alters the mechanism by which such prior art cells are erased in sector or bulk form. Generally speaking, therefore, the present invention is described with reference to the same prior art cell in FIG. 1. It is understood, of course, that the present invention is intended for use with conventional arrays of flash memory cells arranged in traditional rows and columns, and including well-known peripheral circuitry. Accordingly, while such well-known and conventional aspects of flash memory cell arrays, such as bitlines, wordlines, power supplies, control logic for effecting program/erase operations, and similar circuits associated with such devices are not expressly shown herein, it will be appreciated by those skilled in the art that the present invention is entirely compatible with and suited for such applications.

Figure 2:
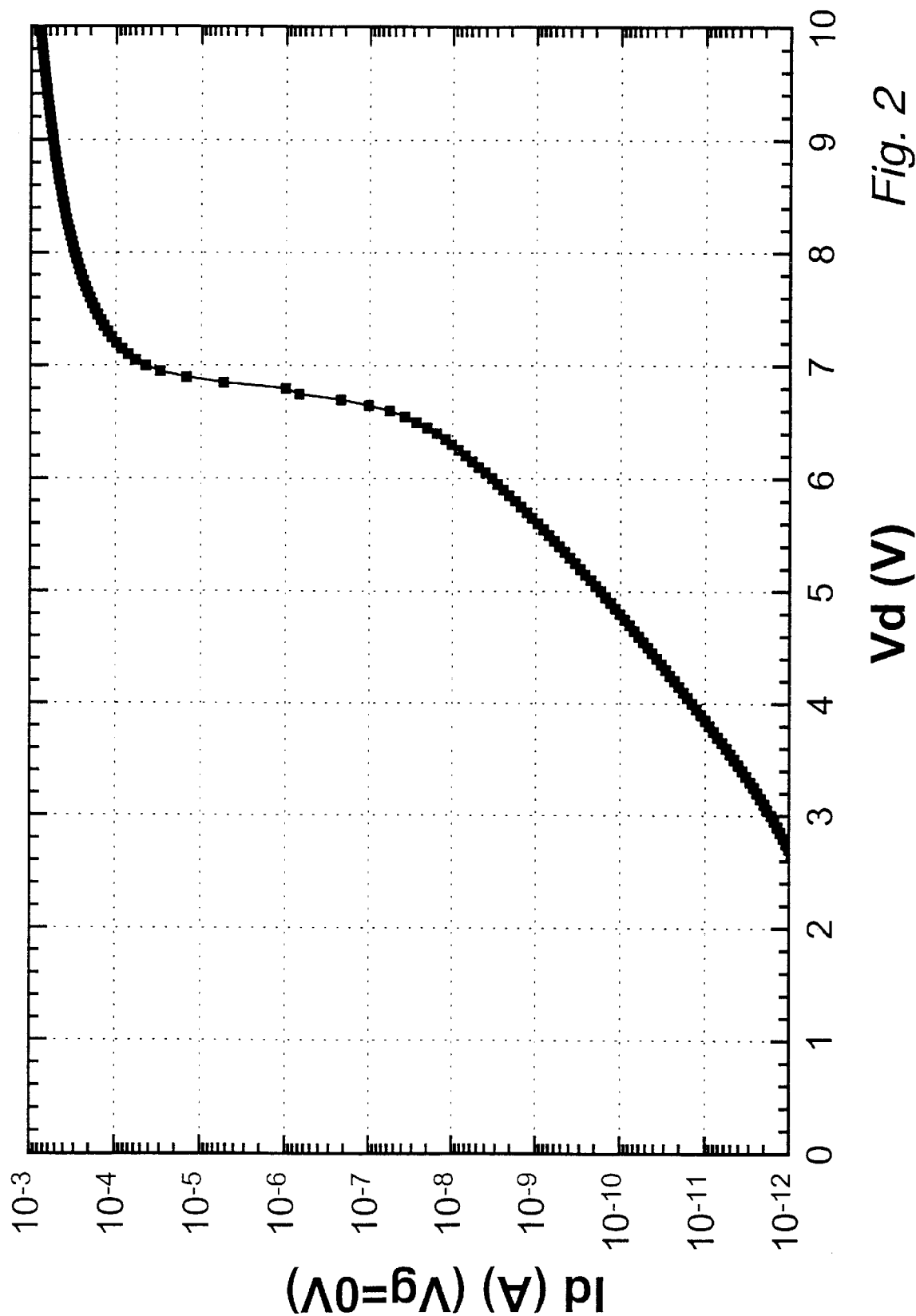
FIG. 2 is a graph of junction breakdown voltage for a conventional flash memory cell.

The present invention operates as follows: instead of applying typical FN biasing conditions, the present invention positively biases either the source or drain junction of the cell close to its associated breakdown region. As shown in FIG. 2, a 6 to 7V is sufficient in most cases to bias such junction into either a pre-breakdown, (band-to-band tunneling) or avalanche breakdown situation. Under these conditions charge carriers are accelerated from such source/drain by a large applied electric field (in this case, a 6–7 V voltage drop). These carriers can create impact ionization or band-to-band tunneling. As a result, a plasma of electron and hole pairs arises near the surface. Some of the electrons and holes have enough energy to surmount substrate (Si)—oxide ($SiO_2$) barrier to inject into the tunnel oxide ($SiO_2$).

Then, depending on an electric field value within such oxide, either electrons or holes are favored to accelerate into the floating gate. To effectuate hole injection, a low voltage (compared to the biased/source drain) is needed for the control gate (poly 2). The unused junction (the other of the source/drain junctions that is not biased to implement the present erase operation) is preferably floated to avoid the possibility of a channel short. From a practical perspective, it can be seen that the present invention biases the cell structure so that a large vertical electrical field is used to generate hot carriers during an erase operation, in contrast to prior art programming operations which instead use a large horizontal field to generate such hot carriers.

The circuits for applying such junction breakdown voltages can be constructed in any number of known ways, and the specifics of the same are not material to the present invention. Furthermore, control circuits and associated embedded algorithms for carrying out program and erase operations in flash arrays are also well known. Therefore the discharging operations of the present invention, including the application of suitable and coordinated voltages to the appropriate structures (including for example, common bit lines, wordlines, substrates and control gates) can be similarly effectuated by conventional and well-known adjustments to such prior art techniques.

Discharge Behavior of Flash Cells Using Mechanism of Present Invention

Figure 3:
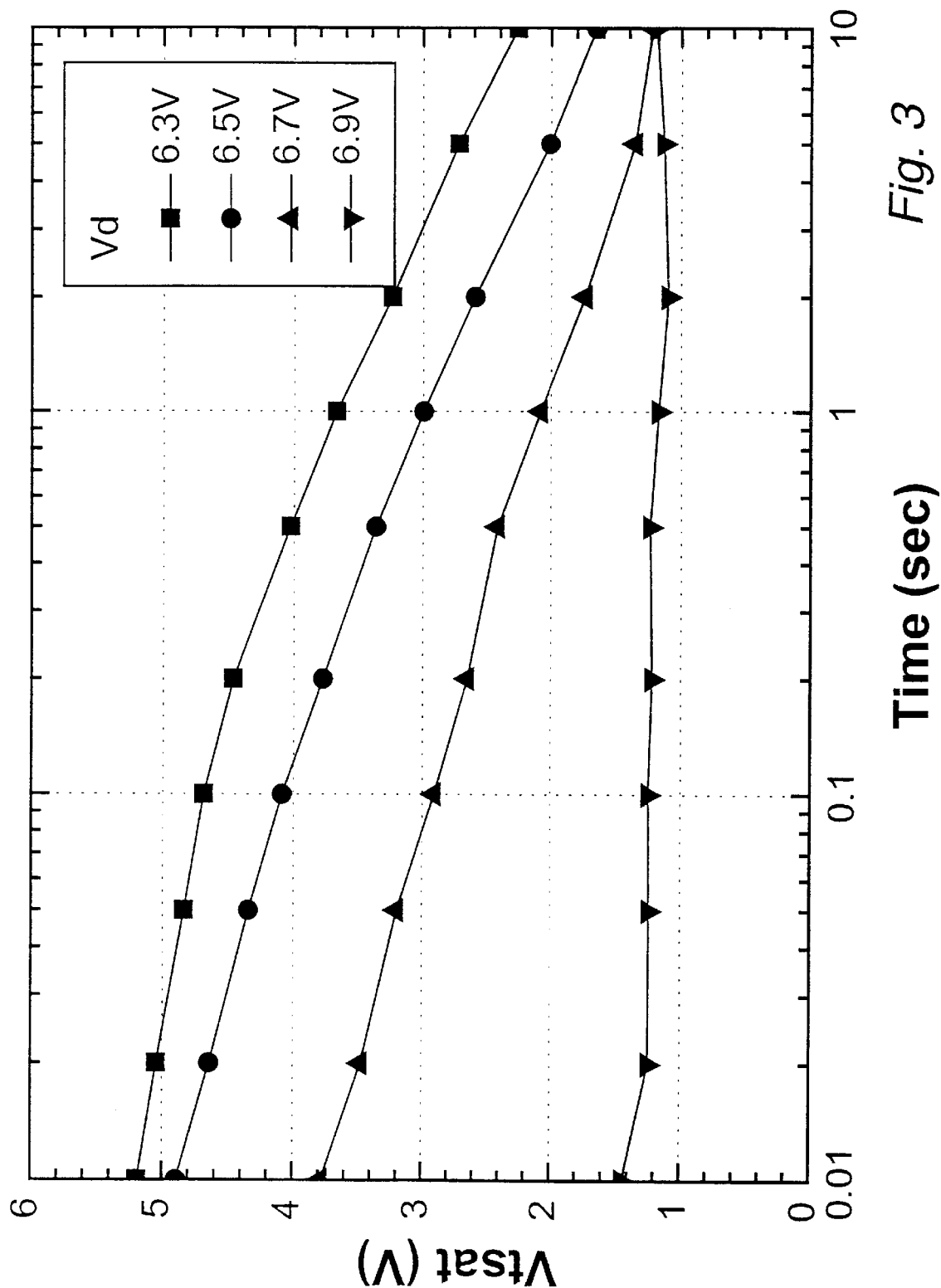
FIG. 3 is a graph illustrating the relationship between varying applied junction discharge voltages applied in accordance with the teachings of the present invention, and resulting threshold voltages for a flash memory cell.

FIG. 3 graphically illustrates the results of experiments by the applicants to test the approach of the present invention. In this graph, threshold voltages of cells in an array are plotted versus time for varying drain erase voltages. From this data, we conclude that junction hot hole injection serves as an efficient erase mechanism for flash cell arrays. In these tests, we have floated the source junction and kept the control gate voltage at zero. As is to be expected, a higher drain voltage creates more available hot holes near the $SiO_2$—Si interface. As a result, a faster discharge is achieved for increasing drain voltages, further demonstrating the usefulness of the present approach.

Figure 4:
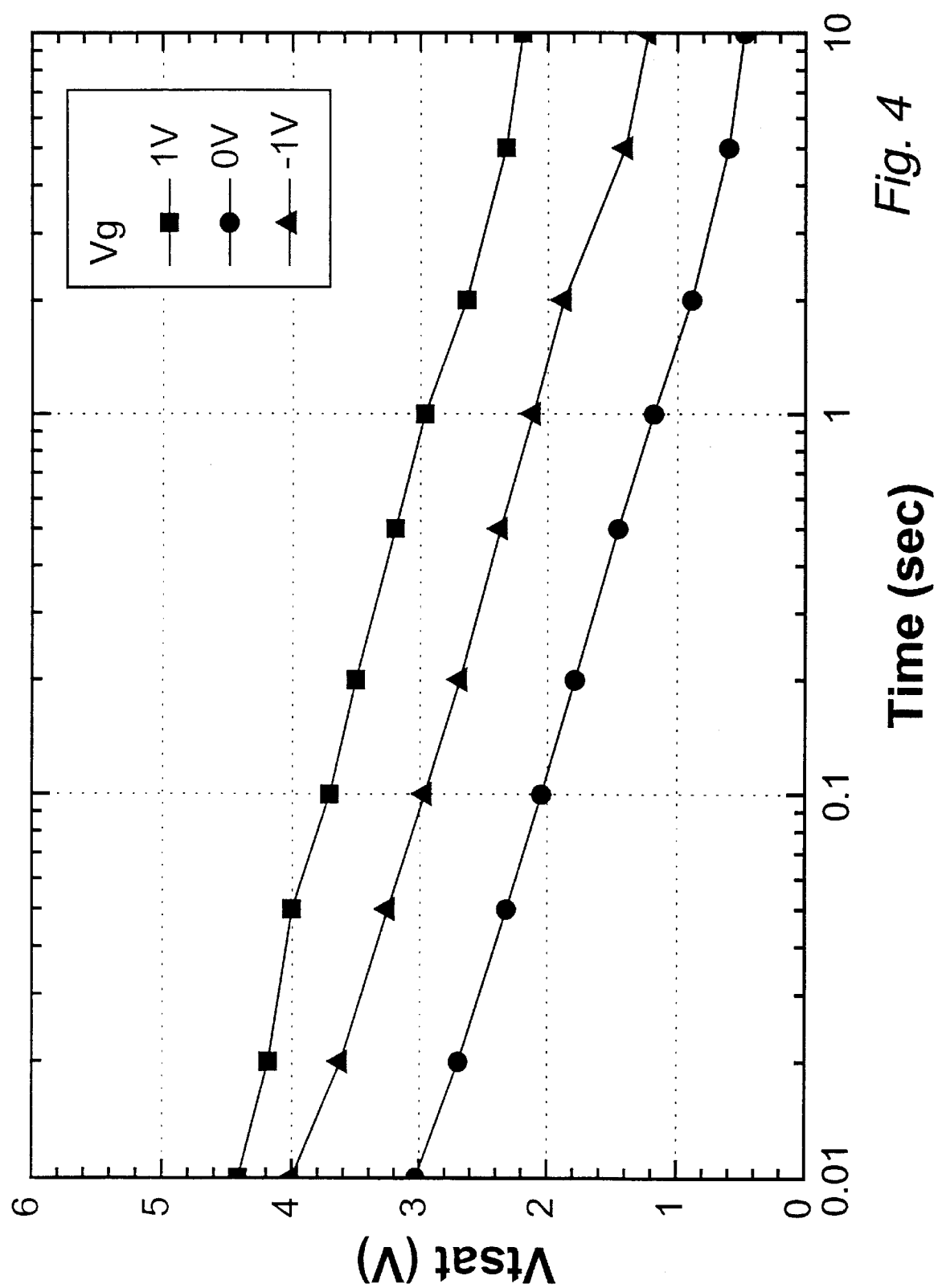
FIG. 4 is a graph illustrating the relationship between varying applied flash control gate voltages applied in accordance with the teachings of the present invention, and resulting threshold voltages for a flash memory cell.

Furthermore, in FIG. 4 it can be seen that by providing a nominal control gate voltage during discharge, the cell discharge curve can also be controlled. Again, as expected, when such control gate is negatively biased, a time to erase is reduced, and when it is positively biased, the time to erase is increased. This graph illustrates very clearly the control possible with the present invention using solely an oxide field difference. Accordingly, if desired, a further negative voltage can be applied to the control gate to increase the generation of positive charge carriers and reduce erasing time for the cell.

As the aforementioned experimental results validate, a voltage on a floating gate of a flash EPROM cell can be discharged merely by applying a high drain voltage and a low gate voltage. This realization opens up an a number of new possible applications for the present invention, including as a replacement for prior art FN tunneling mechanisms used for bulk or sector erase. For example, to accomplish a sector erase in accordance with the teachings of the present invention, all bit lines and wordlines within a sector would be biased according to the above hot hole injection scheme. From the results discussed above, the applicants believe that cells can be discharged with a threshold voltage $V_t$ below 2 volts within 1–5 seconds (depending on junction voltage used).

Self-Confergence Property of Cell Arrays Using Present Invention

As explained earlier, one significant potential problem for NOR-type flash array architectures is over-erase. When cells are discharged with below zero $V_t$ they can leak during read and program operations even where is no voltage on the wordlines. This affects voltage scaling (low voltage operation) and reliability.

Figure 5:
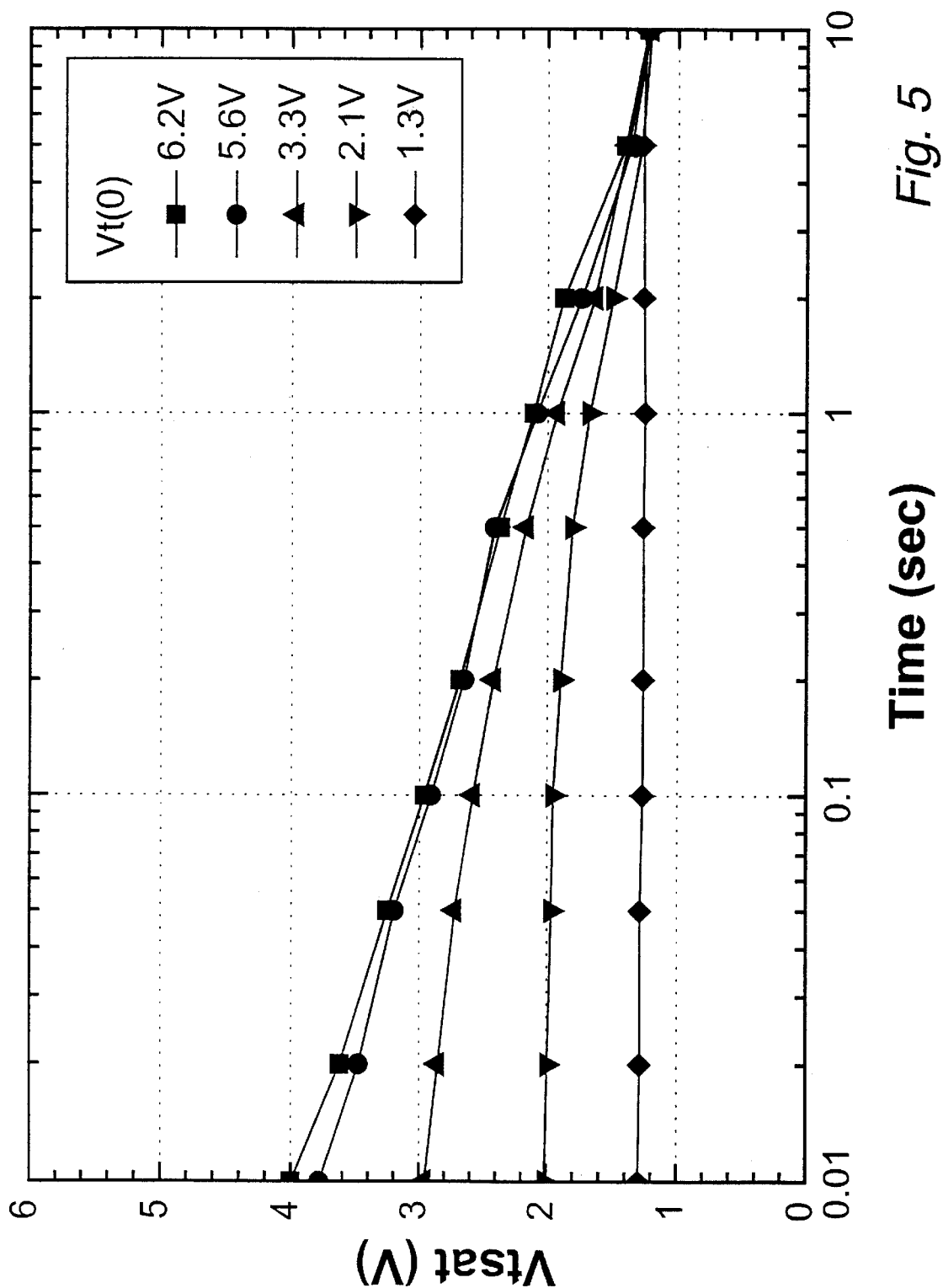
FIG. 5 is a graph illustrating threshold voltage convergence for flash memory cells of different initial threshold voltages erased in accordance with the teachings herein.

The proposed inventive method, however, has an extremely beneficial self-converging characteristic. In FIG. 5, it can be seen that the discharge achieved with the present invention is self limiting, and stops when $V_t$ reaches approximately a preferred target erased value of 1.3 V. As a result, no cell has a $V_t$ below 1.3 after the discharge operation. Applicants believe that the present process is self-limiting and thus controllable because the floating gate should approach a relatively stable and consistent voltage when the oxide electric field achieves a value that equally favors both holes and electrons. In other words, the threshold voltage of the cell converges to the target value during the application of the positive erase voltage, and does not vary substantially thereafter even if the positive erase voltage is still present, because the number of positive and negative carriers moving to the floating gate are approximately equal.

By suitable adjustments of the junction voltage, the control gate voltage, etc., for any particular cell configuration, a self-limiting, uniform and predictable threshold voltage can be effected for every cell in a flash array employing the present invention. A further advantage lies in the fact that, because of the self-convergence property of the present approach, cells can be erased without first pre-programming them to a known threshold voltage condition, another common requirement in the prior art which reduces system performance.

Accordingly, the present invention avoids the potential over-erase problems of the prior art. Because of this self-limiting and self-converging characteristic, a low voltage read (2.7 V or 1.8V with charge pump) is readily achievable. Furthermore, because of the absence of over-erased cells, there are no read and/or program bitline leakage currents. Consequently, cells in a flash memory array erased in accordance with the present teachings are not subject to over-erasure, because the gate dielectric field changes as the cell is erased, and over time reduces the number of generated positive carriers. In this manner, the cells are erased to a target threshold value that is maintained relatively constant thereafter.

Circuit Implementation to Control Discharge

The applicants have also overcome what would otherwise be a significant potential drawback of the present approach: namely, the possibility of large current consumption, or large breakdown voltage variations in devices due to manufacturing and and temperature variations. To control these potential pitfalls, a constant current discharge is used, instead of a constant voltage. In this way, by specifying a fixed amount of current, the junction voltage will automatically adjust according to process and operating temperature for the particular cell structure and operation.

Figure 6:
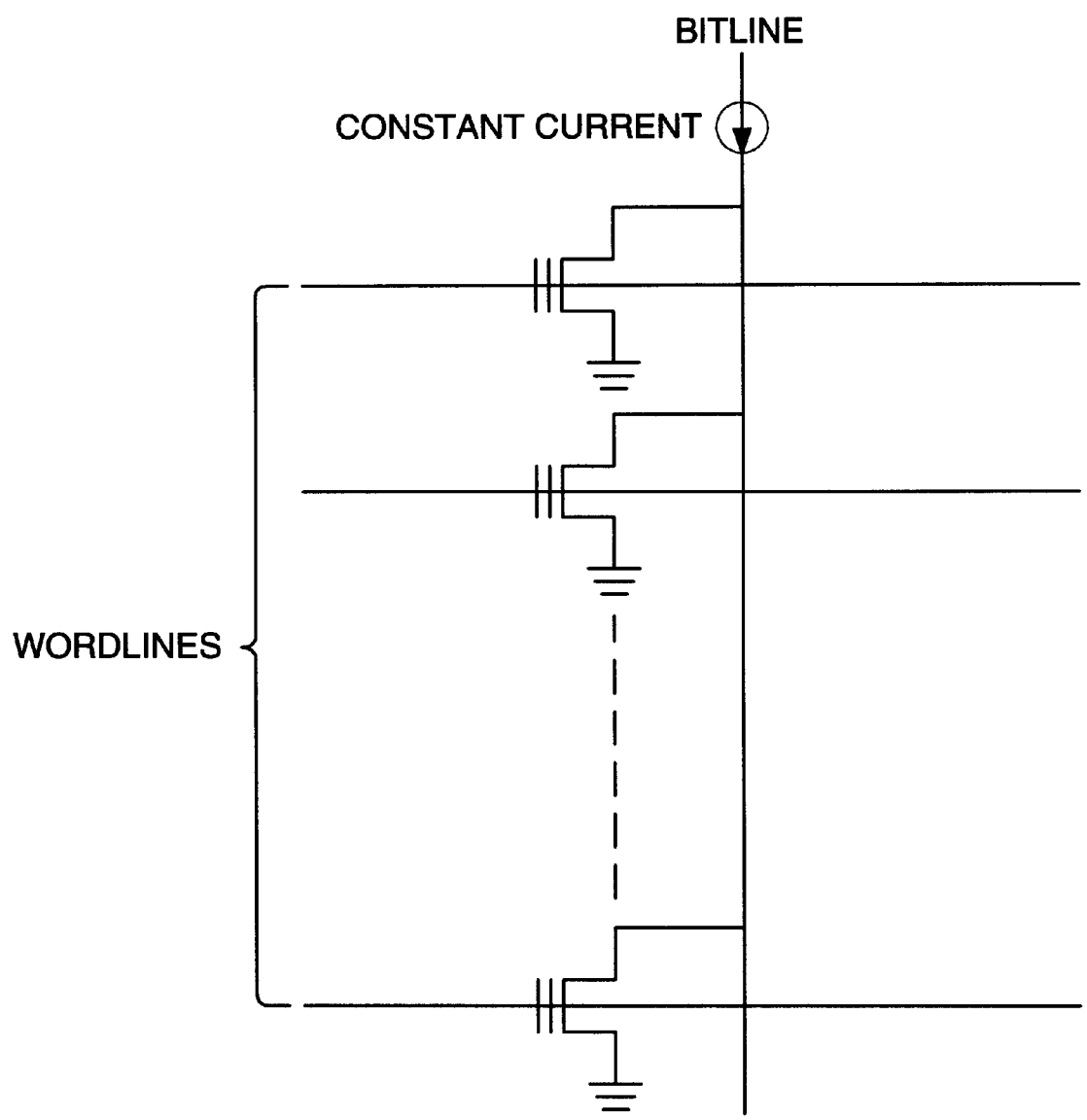
FIG. 6 is an example of a constant current supply source circuit that can be used to discharge flash memory cells.
Figure 7:
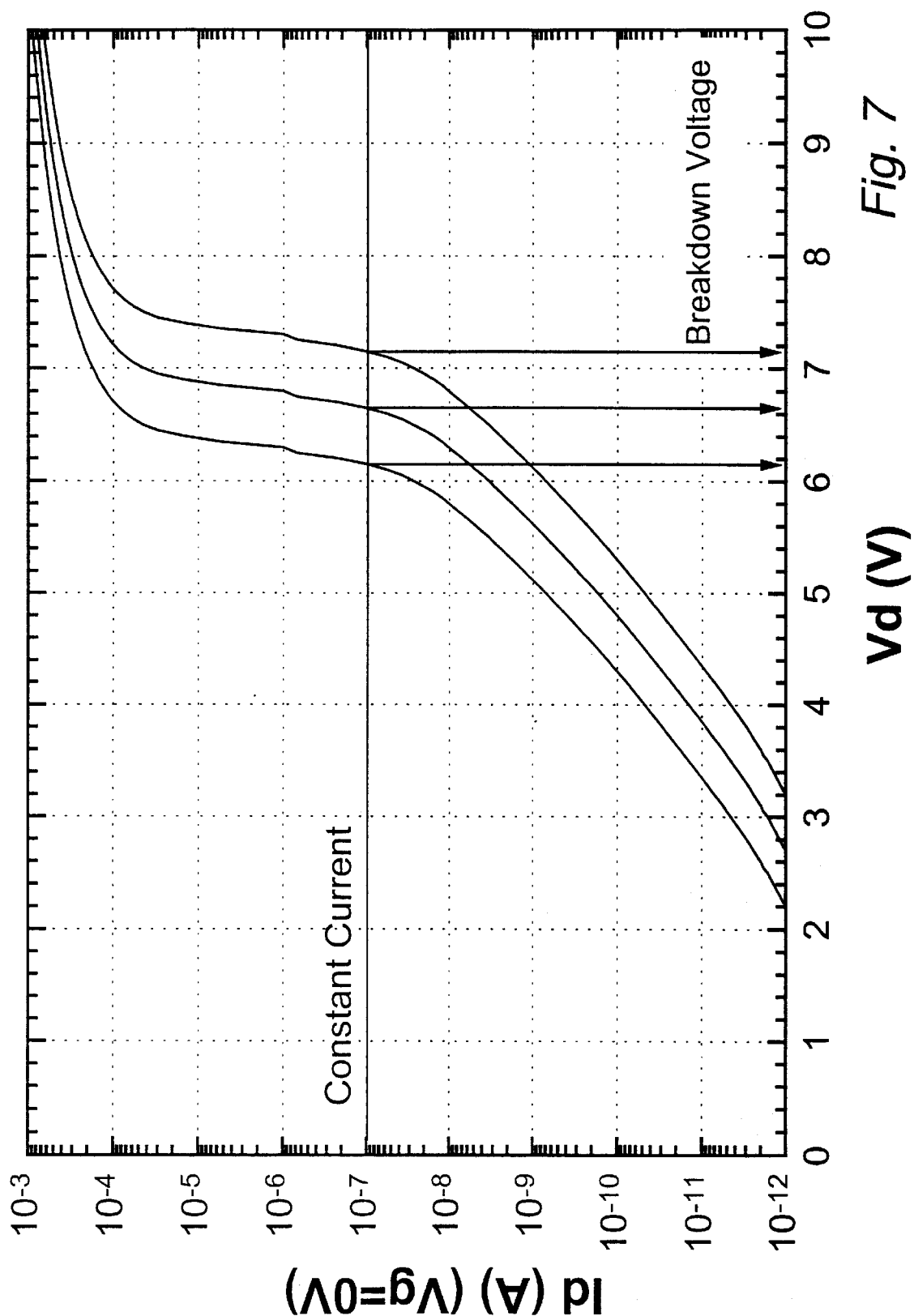
FIG. 7 depicts the operation of a constant current supply source in maintaining an appropriate junction breakdown voltage for flash memory cells having differing junction breakdown voltages.

A typical constant current supply for use in a discharge operation is depicted in FIG. 6. These kinds of circuits are well-known in the art, and are therefore not explained here in any detail. As seen in FIG. 7, for varying junction breakdown curves for varying cell environments (reflecting different processes and/or operating temperature conditions) a constant current implementation ensures that the proper junction voltage ($V_d$) is selected for such environment. Applicant's experimental evidence suggests that the present invention permits threshold voltages of flash memory cells to be changed rapidly to a target erased value regardless of such cell's initial threshold voltage value, thus further corroborating the efficacy of the present approach. In this manner, the applicants have successfully overcome the substantial flash cell threshold voltage variation identified in Haddad et. al. as a continuing problem in prior art hot hole injection techniques.

Comparison between FN Tunneling and Junction Hot Hole Injection

As described above, junction hot hole injection provides a beneficial replacement for FN tunneling for bulk or sector erase in many environments. A comparison chart illustrating the advantages and disadvantages of the two methods is provided below, broken down by traditional key flash cell and array characteristics.

| Characteristic | FN Tunneling (electrons) | Junction Hot Hole Injection |
| --- | --- | --- |
| Voltage Requirement | −9 Negative, +5 Positive | +6 to +7 Positive |
| Process Requirement | Triple Well to Support Negative Voltage | Conventional Twin Well Process |
| Circuit Current Requirement | Negative Charge Pump Small | none required Relatively Large |
| Endurance | 100,000 cycles | 1000 cycles |
| Oxide Field | High | Low |
| Over-Erase | Yes | None Due to Self-Converging |
| Embedded Algorithm | Complex | Simple or None |

The information above points out the fact that hot hole injection is well-known for its tendency to degrade oxide and thus is not useful for applications requiring a large number of programming erase cycles. While this is true also with the approach taken in the present invention, the teachings herein are nonetheless extremely useful and suitable for such applications as EPROM replacements and some embedded applications where 1000 programming erase cycles are more than sufficient.

It will be immediately understood by those skilled in the art that a flash memory cell array integrated circuit can be manufactured using conventional processing means to include the teachings of the present invention. Such article of manufacture could include the inventive methods embodied as replacements for embedded algorithms in known control circuits, as well as usual combinations of flash memory cell arrays and conventional supporting peripheral circuitry bower supplies, address decoders, I/O data buffers, sense amplifiers, reference arrays, counters, timers, etc.). Such processing means and peripheral circuitry can be implemented using any of a number of structures and methods well-known in the art, and are therefore not described here in substantial detail.

It will also be appreciated by those skilled in the art that the above discussion is directed to a preferred embodiment of the present invention, and that the present teachings can be used in a number of different environments, applications, etc. Accordingly, it is intended that the all such alterations and modifications be included within the scope and spirit of the invention as defined by the following claims.

What is claimed is:

1. A method of erasing a memory cell in a flash memory cell array, which cell includes a control gate, a floating gate, a source, a drain, a channel region between the source and drain, and a gate dielectric situated between the floating gate and the channel and an associated substrate, the method including the steps of:

(a) applying a positive erase voltage to either the source or drain of such cell, said erase voltage being generated from a constant current applied to said source or drain so that a voltage is automatically adjusted in a junction of said cell to a value suitable for causing breakdown in such junction; and (b) floating the source or drain of such cell which is not already biased with said positive erase voltage;

(c) grounding the substrate;

(d) wherein said positive voltage is selected to be sufficient to cause positive charge carriers in the form of hot holes to move into the floating gate to erase the cell.

2. The method of claim 1, wherein said positive voltage acts to break down a junction between said source or drain and the substrate.

3. The method of claim 1, wherein a threshold voltage of such cell converges to a target value, and after such target value is achieved, said threshold voltage does not vary substantially because an electric field in the gate dielectric permits an approximately equal number of positive and negative carriers to move into the floating gate.

4. The method of claim 1, further including a step of applying a negative voltage to the control gate to increase said positive charge carrier injection and reduce erasing time for the cell.

5. The method of claim 1, wherein a threshold voltage of the cell converges to a target value during the application of said positive erase voltage, and said threshold voltage does not vary substantially thereafter even if said positive erase voltage is present.

6. The method of claim 1, wherein the cell can be erased without first pre-programming the cell to a known threshold voltage condition.

7. The method of claim 1, wherein only a single supply voltage is needed to erase the cell.

8. The method of claim 1, wherein a plurality of cells within the memory array are erased essentially simultaneously.

9. The method of claim 8, wherein said cells are not over-erased because an electric field in the dielectric reduces a number of said positive carriers after said cells are erased so that a threshold voltage of such erased cells is maintained relatively constant.

10. The method of claim 1, wherein said positive carriers originate from a plasma of surface electron and hole pairs generated as a result of an avalanche breakdown condition induced in a junction between the source or drain and the substrate.

11. An integrated circuit comprising:

an array of flash memory cells, each of said cells having a conduction threshold voltage, a control gate, a floating gate, a source and a drain; and peripheral support circuitry coupled to such array, including a constant current source generator capable of generating a current I; and a control circuit coupled to said array and said peripheral support circuitry for reducing the threshold voltages of the cells to a single target erase value, the control circuit being configured such that:

(a) said constant current source generator can be activated so that a positive erase voltage can be applied to either the source or drain of such cells, said positive erase voltage having a value that is adjusted to a junction breakdown voltage suitable for each of said cells; and (b) whichever of the source or drain of such cells which is not already biased with said positive erase voltage is put into a floating state by said control circuit;

wherein said current I is selected so that said positive erase voltage is sufficient to cause positive charge carriers in the form of hot holes to move into the floating gate to change each of said threshold voltages for each of said cells to said targed erase value without over-erasing any of such cells.

12. The integrated circuit of claim 11, wherein said threshold voltages of said cells are changed to said target value regardless of an initial value of said threshold voltage.

13. The integrated circuit of claim 11, wherein said positive voltage causes an avalanche condition in a junction between said source or drain and the substrate.

14. The integrated circuit of claim 11, wherein said control circuit is further configured such that it can apply a negative voltage to the cell control gates to increase said positive charge carrier injection and reduce erasing time for said cells.

15. The integrated circuit of claim 11, wherein said cells can be erased without first pre-programming them to a known threshold voltage condition.

16. The integrated circuit of claim 11, wherein a threshold voltage of such cell converges to a target value, and after such target value is achieved, said threshold voltage does not vary substantially because an electric field in the gate dielectric permits an approximately equal number of positive and negative carriers to move into the floating gate.

17. The integrated circuit of claim 11, wherein only a single supply voltage is needed to erase the array of cells.

18. The integrated circuit of claim 11, wherein said positive carriers originate from a plasma of surface electron and hole pairs generated as a result of an avalanche breakdown condition induced in a junction between the source or drain and the substrate.

19. A method of making a flash memory integrated circuit, said method including the steps of:

(a) providing an array of flash memory cells in said integrated circuit, each of said cells having a conduction threshold voltage, a control gate, a floating gate, a source and a drain; and (b) providing peripheral support circuitry in said integrated circuit for such array, including a constant current source generator capable of generating a current I; and (c) providing a control circuit coupled to said array and said peripheral support circuitry for reducing the threshold voltages of the cells to a single target erase value, the control circuit being configured such that:

i) said constant current source generator can be activated so that a positive erase voltage can be applied to either the source or drain of such cells, said positive erase voltage having a value that is adjusted to achieve a junction breakdown voltage suitable for each of said cells; and ii) whichever of the source or drain of such cells which is not already biased with said positive erase voltage is put into a floating state by said control circuit;

wherein said current I is selected so that said positive erase voltage is sufficient to cause positive charge carriers in the form of hot holes to move into the floating gate during an erase operation to change each of said threshold voltages for each of said cells to said targeted erase value without over-erasing any of such cells.

20. The method of claim 19, wherein said threshold voltages of said cells can be changed to said target value regardless of an initial starting value of said threshold voltage.

21. The method of claim 19, wherein said threshold voltages of said cells converge to said target value but do not vary substantially thereafter because positive charge carriers moving into the floating gate are reduced in number.

22. The method circuit of claim 19, wherein said positive voltage causes an avalanche condition to occur in a junction between said source or drain and the substrate.

23. The method of claim 19, wherein said control circuit is further configured such that it can apply a negative voltage to the cell control gates to increase said positive charge carrier injection and reduce erasing time for said cells.

24. The method of claim 19, wherein said cells can be erased without first pre-programming them to a known threshold voltage condition.

25. The method of claim 19, wherein said integrated circuit includes only a single supply voltage for erasing said cells.

26. The method of claim 19, wherein said integrated circuit is configured such that during an erase of such cells, said positive carriers originate from a plasma of surface electron and hole pairs generated as a result of an avalanche breakdown condition induced in a junction between the source or drain and the substrate.

27. A circuit for erasing cells in a flash memory cell array, said circuit including:
   a current source generator capable of generating a substantially constant current I;
   a control circuit for applying said constant current to the cells in said array, such that a positive erase voltage signal is effectively applied to a bit line of such array, said bit line being coupled to a source or drain region of said cells, said positive erase voltage being automatically adjusted by said constant current to have a voltage value suitable for causing breakdown in a junction of said cells; and
   further wherein said control circuit applies a floating voltage to whichever of the source or drain of such cells is not already biased with said positive erase voltage;
   wherein said current I is selected so that said positive erase voltage is sufficient to cause positive charge carriers to move into the floating gate during an erase operation to change each of said threshold voltages for each of said cells to said targeted erase value without over-erasing any of such cells; and
   said control circuit being further configured such that said erase operation is effectuated substantially without using Fowler-Nordheim tunnelling.

28. The circuit of claim 27, wherein said threshold voltages of said cells are changed to said target value regardless of an initial value of said threshold voltage.

29. The circuit of claim 27, wherein said threshold voltages of said cells converge to said target value but do not vary substantially thereafter because positive charge carriers moving into the floating gate are reduced in number.

30. The circuit of claim 27, wherein said positive voltage acts to break down a junction between said source or drain and the substrate.

31. The circuit of claim 27, wherein said control circuit is further configured such that it can apply a negative voltage to the cell control gates to increase said positive charge carrier injection and reduce erasing time for said cells.

32. The circuit of claim 27, wherein said cells can be erased without first pre-programming them to a known threshold voltage condition.

33. The circuit of claim 27, wherein only a single supply voltage is used to erase the cells.

34. The circuit of claim 27, wherein said positive carriers originate from a plasma of surface electron and hole pairs generated as a result of an avalanche breakdown condition induced in a junction between the source or drain and the substrate.

35. A method of reducing negative charge stored in a flash memory cell, which cell includes a control gate, a floating gate, a source, and a drain, the method including the steps of:
   (a) applying a single positive voltage signal to either the source or drain of such cell to cause an avalanche condition in a junction associated with such source or drain so that positive charge carriers are generated, said avalanche condition being caused by a breakdown voltage that is adjusted for said cell by a constant current source; and
   (b) floating the source or drain of such cell which is not already biased with said positive voltage;
   (c) causing said positive charge carriers to move into the floating gate to reduce the negative charge of the cell;
   wherein said negative charge is reduced substantially without using Fowler-Nordheim tunnelling.

36. The method of claim 35, wherein a threshold voltage of such cell converges to a target value, and after such target value is achieved, said threshold voltage does not vary substantially because an approximately equal number of positive and negative carriers move into the floating gate.

37. The method of claim 35, further including a step of applying a negative voltage to the control gate to increase said positive charge carrier injection.

38. The method of claim 35, wherein a threshold voltage of the cell converges to a target value during the application of said positive voltage signal, and said threshold voltage does not vary substantially thereafter even if said positive voltage signal is still present.

39. The method of claim 35, wherein removing said negative charge places such cell in an erased state, and said erased state can be obtained without first pre-programming the cell to a known threshold voltage condition.

40. The method of claim 35, wherein said negative charge is removed essentially simultaneously from a plurality of cells within the memory array so as to place such cells in an erased state.

41. The method of claim 40, wherein said cells are not over-erased because said positive carriers are reduced in number after said cells are erased so that a threshold voltage of such cells is maintained relatively constant.

* * * * *